United States Patent [19]

Phelan et al.

[11] Patent Number: 5,212,413

[45] Date of Patent: May 18, 1993

[54] STABLE, PROGRAMMABLE LOW-DISSIPATION REFERENCE CIRCUIT

[75] Inventors: Cathal G. Phelan; Peter H. Voss, both of San Jose, Calif.; Thomas J. Davies, Eindhoven, Netherlands; Cormac M. O'Connell, Kanata, Canada; Leonardus C. M. G. Pfennings, deceased, late of Sittard; Henricus J. Kunnen, legal representative, Valkenswaard, both of Netherlands; Hans Ontrop, Eindhoven, Netherlands

[73] Assignee: U.S. Philips Corp., New York, N.Y.

[21] Appl. No.: 726,470

[22] Filed: Jul. 8, 1991

[30] Foreign Application Priority Data

Jul. 9, 1990 [NL] Netherlands .................. 9001558

[51] Int. Cl.$^5$ .................. H03K 3/01; H03K 19/003
[52] U.S. Cl. .................. 307/296.8; 307/202.1; 307/441; 307/465; 365/189.09; 365/225.7; 365/96
[58] Field of Search .................. 307/202.1, 296.8, 441, 307/465; 365/189.09, 225.7, 230.08, 96

[56] References Cited

U.S. PATENT DOCUMENTS

| | | | |
|---|---|---|---|
| 4,532,607 | 7/1985 | Uchida | 307/202.1 |
| 4,621,346 | 11/1986 | McAdams | 307/202.1 |
| 4,785,199 | 11/1988 | Kolodny et al. | 307/202.1 |
| 4,903,111 | 2/1990 | Takemae et al. | 307/202.1 |
| 4,922,134 | 5/1990 | Hoffmann et al. | 307/202.1 |
| 5,038,368 | 8/1991 | Lee | 307/202.1 |

Primary Examiner—Edward P. Westin
Assistant Examiner—Richard Roseen
Attorney, Agent, or Firm—Steven R. Biren

[57] ABSTRACT

When using a laser programmable fuse, a circuit should be 100% stable both before and after the fuse is blown. So far no CMOS circuit can be 100% stable without drawing a constant current. With the "Master fuse Enable" scheme one fuse circuit (master fuse) draws current while disabling all other fuse circuits on-chip. Thus giving 100% stability and reducing power consumption on a chip where no fusing has been done. If, however, one wished to use the rest of the fuses, then the master fuse is blown and all fuse circuits now become active and draw current.

2 Claims, 1 Drawing Sheet

STABLE, PROGRAMMABLE LOW-DISSIPATION REFERENCE CIRCUIT

BACKGROUND OF THE INVENTION

The invention relates to a programmable reference circuit which, prior to programming, is in a first and after programming in a second logic state. The circuit comprises a flipflop-like circuit which in a non-programmed state is formed by two inverters in a feedback arrangement. A first inverter includes an active element and, arranged in series therewith a programmable element, which are arranged in series between two power supply terminals. An output of this first inverter is connected to an input of a second inverter, whose output supplies the reference voltage to be generated and is fed back to the input of the first inverter. The second inverter is, for example, a CMOS-inverter.

The invention further relates to an integrated circuit comprising a memory, in which for setting redundancy circuits for the substitution of defective rows and columns of memory cells a plurality of reference circuits are provided. Such an integrated circuit is described in a publication in the IEEE Journal of Solid State Circuits, Vol. 23, No. 5, October 1988, more specifically in chapter XI and FIG. 8.

A reference circuit of the type described above is known per se and is shown in FIG. 1. The reference circuit includes a first active element constituted by a PMOS-transistor P1 which is arranged in series with a programmable element, in this case a fuse F which together form a first inverter. The circuit further includes a second inverter assembled from a series arrangement of two PMOS-transistors P2 and P3 and two NMOS-transistors N1 and N2. The output L of the first inverter is connected to the control electrodes of the transistors P2, P3 and N1. The NMOS-transistor N2 receives a fixed voltage VREF (for example ($V_{DD}$)) at its control electrode to avoid voltage-stress on the transistor N1 as this transistor is a transistor of submicron dimensions. An NMOS-transistor N3 acting as a capacitance is connected between the supply voltage $V_{SS}$ and the output OUT of the second inverter while a PMOS-transistor P4 arranged as a capacitance is connected between the output L of the first inverter and the supply voltage $V_{DD}$. The circuit operates as follows: as long as the fuse has not melted, it will be low-ohmic, so that after the supply voltage $V_{DD}$ has been switched on, charging of the capacitance constituted by the transistor P4 will be slower than charging of the capacitance constituted by the transistor N3, since both the junction point L and the junction point OUT will have zero potential after switch-on. The transistors P2 and P3 will be conductive, which causes the capacitance formed by transistor N3 to be charged. However, transistor P1 will also be conductive, but the junction point L will be kept at a low potential by the low-ohmic fuse F. The stable final state after switch-on of the circuit will then ultimately have a low level for the junction point L and a high logic level for the junction point OUT. However, after the fuse has melted, the junction point L will be charged to $V_{DD}$ so that the transistors P2 and P3 will be rendered non-conductive and the transistor N1 will start conducting. In response thereto the capacitance N3 will be discharged so that the output OUT will assume a low logic level. If now however the programmed circuit in which the fuse has melted, is switched off, then, due to the ever present leakage currents all the junction points in the circuit will in the end discharge. After the circuit has been switched on again, the junction point L and the junction point OUT have a low potential so that both transistor P1 and the transistors P2 and P3 will start to conduct. The two capacitances formed by the transistor P4 and N3 will not be in the charged state and be charged via the said transistors P1 and P2, P3, respectively. Now, however, it is uncertain which logic level the output OUT will assume, as charging of the capacitances is decisive for the ultimate logic state. So this state is determined by the RC-ratios of transistors P1 and capacitance P4 and the resistance formed by the transistors P2 and P3 and the capacitance N3. As in the IC-technology the tolerances of the different parameters cannot be controlled to perfection, it consequently remains uncertain what the ultimate logic state will be. For the case in which the capacitance N3 is charged faster than the capacitance P4 the transistor P1 will be forced out of the conductive state at an earlier instant than the transistor P2 and P3. This results in the junction point L not being charged anymore, and as a consequence thereof the transistors P2 and P3 are not rendered non-conductive and the junction point OUT is additionally charged until the logic high level. The foregoing procedure is unwanted as, after programming of the fuse, i.e. after the fuse has blown, the output must provide the desired logic low level. This situation is considered to be disadvantageous.

SUMMARY OF THE INVENTION

The invention has for its objects to provide a low-dissipation programmable stable reference circuit which, both prior to and after programming will rapidly assume, after switch-on of the supply voltage, the desired logic state.

The programmable reference circuit in accordance with the invention is therefore characterized, in that a second active element whose control electrode is connected to one of the supply voltages, is arranged in parallel with active element in the first inverter.

The invention further relates to an integrated circuit having a memory, in which for setting redundancy circuits for substitution of defective rows or columns of memory cells of the memory a plurality of reference circuits are provided, characterized, in that a first reference circuit is arranged as being the reference circuit as claimed in claim 1 and that further reference circuits are provided in which reference circuits, a second active element, whose control electrode is coupled to the output of the first reference circuit, is arranged in parallel with the active element in the first inverter.

BRIEF DESCRIPTION OF THE DRAWING

The invention will now be described in greater detail with reference to an example shown in the accompanying drawing, wherein.

DESCRIPTION OF THE PREFERRED EMBODIMENTS

Figure 1:
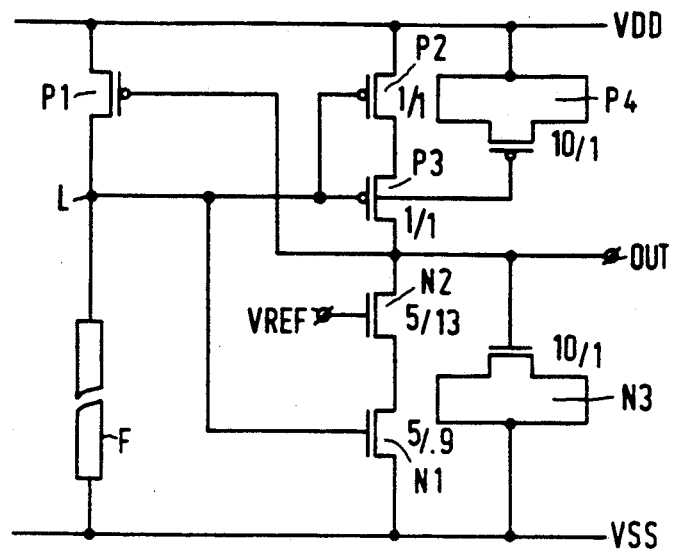
FIG. 1 shows a reference circuit in accordance with the prior art.
Figure 2:
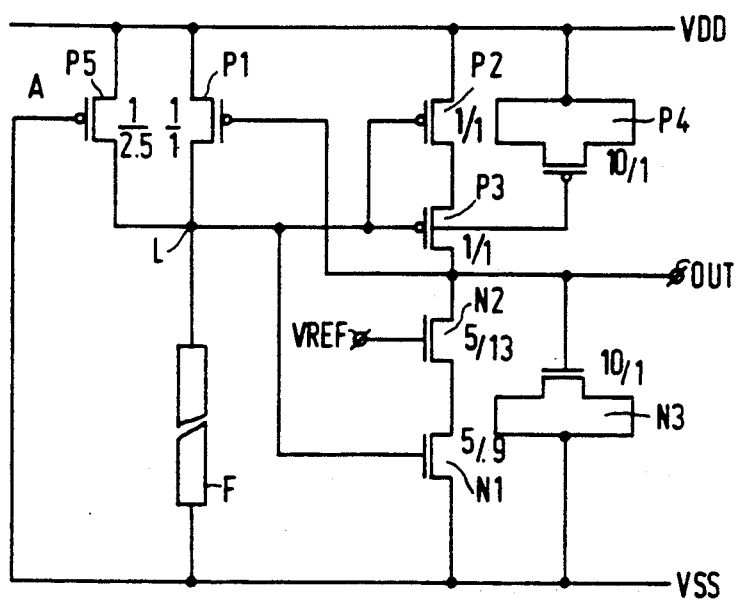
FIG. 2 shows a reference circuit in accordance with the invention.

The circuit shown in FIG. 2 comprises the same elements as shown in FIG. 1, with the exception of an additional transistor P5, whose control electrode is connected to $V_{SS}$. Providing this PMOS-transistor P5 ensures that even after programming, i.e. melting of the fuse F, the junction point L can nevertheless be charged in spite of the fact that the capacitance N3 and the output are charged at a higher rate than the capacitance P4, since although charging the capacitance N3 will force the PMOS-transistor P1 out of conduction, then nevertheless the junction point L will be charged via the transistor P5, so that ultimately the NMOS-transistors N1 and N2 will discharge the capacitance N3. By adding the PMOS-transistor P5 it is consequently ensured that the reference circuit will invariably be in a desired stable state.

Many elements which can be programmed by, for example, by means of a laser or by driving them electrically are used in static random access memories to implement redundancy. If somewhere in the matrix memory of the SRAM an error is detected then by adequate programming, that is to say by blowing a fuse, or electric programming of an electrically programmable transistor, one of the redundant rows or columns of memory cells can be substituted therefor. The circuit shown in FIG. 2 invariably gives a desired logic level both prior to and after programming.

Figure 3:
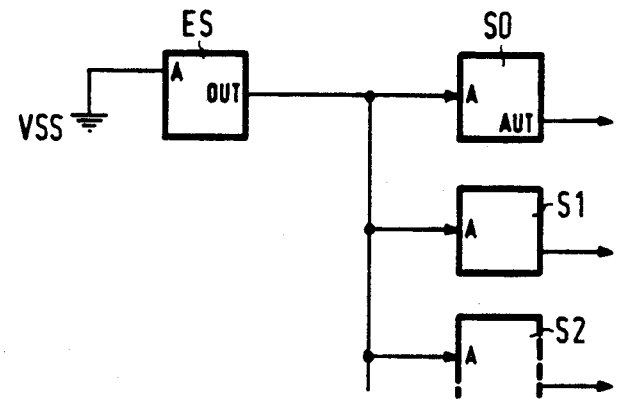
FIG. 3 shows an embodiment of an application of the circuit in accordance with the invention.

FIG. 3 shows an embodiment of a usage of the reference circuit as shown in FIG. 2. The integrated circuit, for example a SRAM, includes a plurality of these reference circuits, and there are as many circuits as elements or fuses required here, plus one extra special programmable circuit. The extra circuit ES is in every respect identical to the circuit shown in FIG. 2. The remaining reference circuits S0, S1, S2 etc. up to Sn are of the same structure as the circuits of FIG. 2, with the exception that the control electrode A of the PMOS transistor P5 is not connected to the supply voltage $V_{SS}$ but to the output OUT of the additional circuit ES. This has the following advantage. As long as the fuse F in FIG. 2 has not melted, some dissipation will occur since transistor P5 is always conducting. The dissipation is a static dissipation which is disadvantageous for CMOS-circuits, for CMOS-memories in particular. CMOS-SRAM's actually require many reference circuits so that the circuit shown in FIG. 2 cannot be utilized without further measures. The usage shown in FIG. 3 substantially fully avoids the said static dissipation. The circuits S0, S1 to Sn, inclusive receive from the extra circuit ES the output signal OUT at the control electrode of PMOS-transistor P5. As long as the integrated circuit with the SRAM does not require redundancy programming, all the circuits S0 to Sn, inclusive receive the logic high level at the control electrode A of PMOS-transistor P5 so that this transistor is in the cut-off state and no static dissipation will occur.

We claim:

1. A programmable reference circuit which, prior to programming, is in a first and after programming in a second logic state and which includes a first and a second cross-wise coupled inverter which are each connected between two power supply lines, the first inverter including an active element and a programmable element connected in series therewith, characterized in that a second active element whose control electrode is directly and continuously connected to one of the supply lines is arranged in parallel with the active element of the first inverter.

2. An integrated circuit comprising a memory, in which a plurality of reference circuits having outputs for setting redundancy circuits for substitution of defective rows of columns of memory cells of the memory are provided, characterized in that a first reference circuit is the reference circuit as claimed in claim 1 and that further reference circuits are provided, in which reference circuits a second active element, whose control electrode is coupled to an output of the first reference circuit, is arranged in parallel with the active element of the first inverter.

* * * * *